US009246715B1

(12) United States Patent
Chan et al.

(10) Patent No.: US 9,246,715 B1
(45) Date of Patent: Jan. 26, 2016

(54) PRE-EMPHASIS CIRCUITRY INCLUDING A PRE-EMPHASIS VOLTAGE VARIATION COMPENSATION ENGINE

(75) Inventors: Allen Chan, San Jose, CA (US); Wilson Wong, San Francisco, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 493 days.

(21) Appl. No.: 12/432,136

(22) Filed: Apr. 29, 2009

(51) Int. Cl.
*H03K 19/094* (2006.01)
*H04L 25/02* (2006.01)
*H03K 19/003* (2006.01)

(52) U.S. Cl.
CPC ...... *H04L 25/0272* (2013.01); *H03K 19/00315* (2013.01); *H03K 19/00361* (2013.01)

(58) Field of Classification Search
CPC .............. H04L 25/028; H04L 25/0282; H04L 25/03343; H04L 25/061; H04L 25/0292; H03K 19/018514; H03K 19/018585; H03K 17/162; H03K 19/00323; H03K 19/018528; H03K 2005/00065; H03K 3/356034; H03K 5/131; H03K 5/133
USPC ........ 326/80, 81, 83, 86, 87, 26, 27; 327/108, 327/109, 112, 379, 389, 391, 333, 65, 66, 327/67; 375/295, 260, 229, 222, 240.29
See application file for complete search history.

(56) References Cited

U.S. PATENT DOCUMENTS

| 6,956,407 | B2 * | 10/2005 | Baig et al. ................ 327/65 |
|---|---|---|---|
| 6,977,534 | B2 * | 12/2005 | Radelinow .................... 327/112 |
| 7,034,574 | B1 * | 4/2006 | Li .................................. 326/83 |
| 7,196,557 | B1 * | 3/2007 | Kwasniewski et al. ....... 327/108 |
| 7,227,375 | B2 * | 6/2007 | Groen et al. .................... 326/27 |
| 7,256,624 | B2 * | 8/2007 | Cheng et al. .................. 327/112 |
| 7,512,193 | B1 * | 3/2009 | Shing et al. .................... 375/296 |
| 7,538,588 | B2 * | 5/2009 | Liu et al. ........................ 327/108 |
| 7,696,787 | B2 * | 4/2010 | De Araujo et al. ............. 326/86 |
| 7,848,402 | B1 * | 12/2010 | Wang et al. .................... 375/232 |
| 2004/0022311 | A1 * | 2/2004 | Zerbe et al. .................... 375/229 |
| 2006/0034358 | A1 * | 2/2006 | Okamura ........................ 375/219 |
| 2006/0158225 | A1 * | 7/2006 | Stojanovic et al. ............. 326/87 |
| 2006/0188043 | A1 * | 8/2006 | Zerbe et al. .................... 375/346 |
| 2006/0280272 | A1 * | 12/2006 | Stojanovic .................... 375/355 |
| 2007/0002967 | A1 * | 1/2007 | Dally ............................ 375/296 |
| 2007/0091993 | A1 * | 4/2007 | Yang ............................. 375/233 |
| 2009/0067484 | A1 * | 3/2009 | Zerbe et al. .................... 375/232 |
| 2009/0267640 | A1 * | 10/2009 | Kuzmenka ..................... 326/30 |

* cited by examiner

*Primary Examiner* — Alexander H Taningco
*Assistant Examiner* — Christopher Lo
(74) *Attorney, Agent, or Firm* — Mauriel Kapouytian Woods LLP; Ararat Kapouytian

(57) ABSTRACT

A pre-emphasis circuitry that includes (1) a pre-emphasis voltage variation compensation (PVVC) engine having a transition detection circuit and (2) a compensation driver coupled to the PVVC engine is described. In one embodiment, the compensation driver reduces data dependent voltage variations in pre-emphasis provided by the pre-emphasis circuitry. In one embodiment, in response to a predetermined data pattern detected by the PVVC engine, the compensation driver provides an additional boost to performance critical capacitive nodes of the pre-emphasis circuitry. The additional boost causes the performance critical capacitive nodes to charge or discharge more rapidly. In one embodiment, the PVVC engine further includes a digital finite impulse response (FIR) filter coupled to the transition detection circuit. Also, in one embodiment, the PVVC engine further includes an FIR delay circuit coupled to the digital FIR filter and a synchronizer circuit coupled to the digital FIR filter and the FIR delay circuit, where the FIR delay circuit introduces latency to match-delay produced by the transition detection circuit and the synchronizer circuit synchronizes data to be sent to the main driver, the pre-emphasis driver, and the compensation driver.

21 Claims, 3 Drawing Sheets

PRE-EMPHASIS CIRCUITRY INCLUDING A PRE-EMPHASIS VOLTAGE VARIATION COMPENSATION ENGINE

BACKGROUND

The present invention relates to pre-emphasis circuitry.

As data rates and bandwidth requirements of serial links continue to increase, so does the demand and complexity placed on the transceiver designs to deliver solutions to maximize signal integrity between chips. Normally, the transmission medium more strongly attenuates the higher frequency components of a transmitted signal than the lower frequency components. This variation in the frequency response of the transmission medium yields data-dependent jitter and other inter symbol interference (ISI) effects.

Pre-emphasis is a common technique used, on the transmitter side, to counteract the effects of high frequency losses caused by the transmission medium. Pre-emphasis boosts the higher frequency components of the transmitted signal. This helps equalize the frequency response of the signal received at the receiver. In other words, it reduces the difference between the low-frequency and high-frequency components of the received signal, which counteracts the ISI effects from the transmission medium.

In some pre-emphasis circuitry, particularly those with high parasitic effects (e.g., high parasitic capacitance effects), at higher data rates, the pre-emphasis voltage varies based on variations in the data. These variations degrade the effectiveness of the pre-emphasis circuitry in counteracting the frequency response difference due to the transmission medium.

Embodiments of the pre-emphasis circuitry of the present invention arise in this context.

SUMMARY

In one aspect, an embodiment of the pre-emphasis circuitry of the present invention compensates for data dependent pre-emphasis variations. With such compensation, the pre-emphasis circuitry can provide effective pre-emphasis at higher date rates even when the pre-emphasis circuitry has high parasitic effects. Parasitic effects increase with a wider programmability range in the pre-emphasis circuitry and, in some cases, a smaller process node used for fabricating the pre-emphasis circuitry. Thus, an embodiment of the pre-emphasis circuitry of the present invention can provide effective pre-emphasis at higher date rates even when the pre-emphasis circuitry has a wider programmability range and was fabricated using a smaller process node. In other words, an embodiment of the pre-emphasis circuitry of the present invention supports a wider range of features (e.g., supports a wider programmability range) without sacrificing performance (e.g., data speed). The wider programmability range may, among other things, include a wider range of output voltages and a wider range of pre-emphasis levels. Thus, an embodiment of the pre-emphasis circuitry of the present invention supports a wider range of data rates, output voltage swings, and pre-emphasis levels. The support of a wider range of features is particularly useful in the context of programmable integrated circuits (ICs), such as, for example, programmable logic devices (PLDs).

In one embodiment, the pre-emphasis circuitry includes (1) a pre-emphasis voltage variation compensation (PVVC) engine having a transition detection circuit and (2) a compensation driver coupled to the PVVC engine. In one embodiment, the compensation driver reduces data dependent voltage variations in pre-emphasis provided by the pre-emphasis circuitry. In one embodiment, in response to a predetermined data pattern detected by the PVVC engine, the compensation driver provides an additional boost to performance critical capacitive nodes of the pre-emphasis circuitry. The additional boost causes the performance critical capacitive nodes to charge or discharge more rapidly.

In one embodiment, the PVVC engine further includes a digital finite impulse response (FIR) filter coupled to the transition detection circuit. Also, in one embodiment, the PVVC engine further includes an FIR delay circuit coupled to the digital FIR filter and a synchronizer circuit coupled to the digital FIR filter and the FIR delay circuit, where the FIR delay circuit introduces latency to match delay produced by the transition detection circuit and the synchronizer circuit synchronizes data to be sent to the main driver, the pre-emphasis driver, and the compensation driver.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
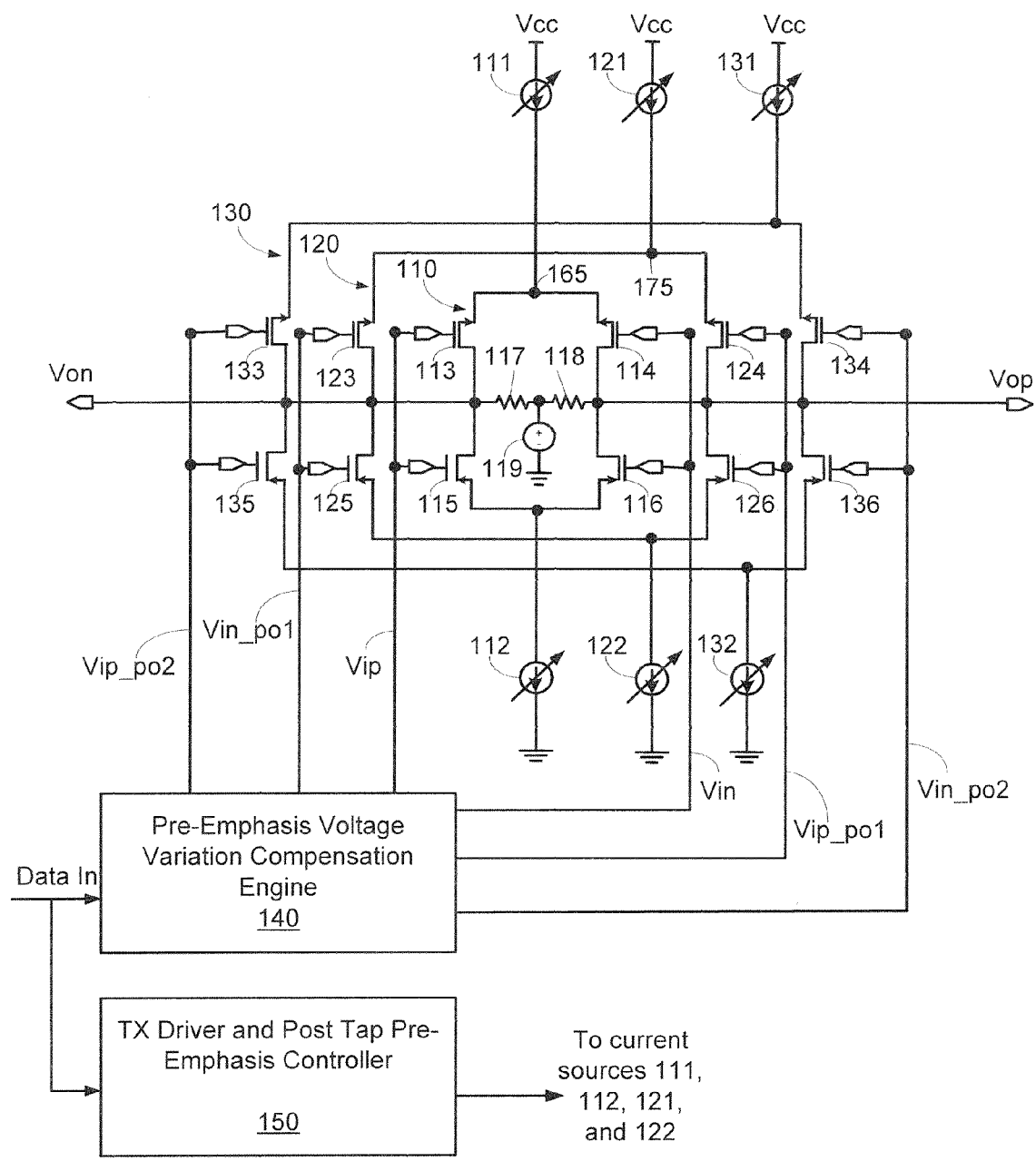
FIG. 1 is a schematic diagram of one embodiment of a pre-emphasis circuitry of the present invention.

FIG. 1 is a schematic diagram of one embodiment of a pre-emphasis circuitry of the present invention. In FIG. 1, pre-emphasis circuitry 100 includes main driver 110 (which may also herein be referred to as transmit driver 110), pre-emphasis driver 120, compensation driver 130, pre-emphasis voltage variation compensation (PVVC) engine 140, and transmit driver and post tap pre-emphasis (TDPTP) controller 150, which are coupled as shown.

Main driver 110 includes current sources 111 and 112, switches 113 to 116, resistors 117 and 118, and common mode voltage source 119, which are coupled as shown in FIG. 1. Current sources 111 and 112 may also herein be referred to as main driver current sources 111 and 112. Similarly, switches 113 to 116 may also herein be referred to as main driver switches 113 to 116. In one embodiment, switches 113 and 114 are p-channel metal oxide semiconductor (PMOS) transistors, whereas switches 115 and 116 are n-channel metal oxide semiconductor (NMOS) transistors. Also, in one embodiment, the same control signal is applied to the switches on the same leg of the driver. In other words, the same control signal (Vip) is applied to switches 113 and 115.

Similarly, the same control signal (Vin) is applied to switches 114 and 116. As a result, in one embodiment, when switch 113 is on, switch 115 is off and vice versa. Similarly, in one embodiment, when switch 114 is on, switch 116 is off and vice versa. Also, in one embodiment, the control signal applied to one leg of the driver is the compliment of that applied to the other leg of the driver. In other words, Vip is the complement of Vin. Thus, when a binary high signal (e.g., a 1 bit) is applied to switches 113 and 115, a binary low signal (e.g., a 0 bit) is applied to switches 114 and 116. Therefore, in one embodiment, when switch 113 is on, switch 115 is off, switch 114 is off, and switch 116 is on. Similarly, in one embodiment, when switch 113 is off, switch 115 is on, switch 114 is on, and switch 116 is off.

Pre-emphasis driver 120 includes current sources 121 and 122 and switches 123 to 126, which are coupled as shown in FIG. 1. Current sources 121 and 122 may also herein be referred to as pre-emphasis driver current sources 121 and 122. Similarly, switches 123 to 126 may also herein be referred to as pre-emphasis driver switches 123 to 126. In one embodiment, switches 123 and 124 are PMOS transistors, whereas switches 125 and 126 are NMOS transistors. Also, in one embodiment, the same control signal is applied to the switches on the same leg of the driver. In other words, the same control signal (Vin_po1) is applied to switches 123 and 125. Similarly, the same control signal (Vip_po1) is applied to switches 124 and 126. As a result, in one embodiment, when switch 123 is on, switch 125 is off and vice versa. Similarly, in one embodiment, when switch 124 is on, switch 126 is off and vice versa. Also, in one embodiment, the control signal applied to one leg of the driver is the compliment of that applied to the other leg of the driver. In other words, Vin_po1 is the complement of Vip_po1. Thus, when a binary high signal is applied to switches 123 and 125, a binary low signal is applied to switches 124 and 126. Therefore, in one embodiment, when switch 123 is on, switch 125 is off, switch 124 is off, and switch 126 is on. Similarly, in one embodiment, when switch 123 is off, switch 125 is on, switch 124 is on, and switch 126 is off.

Compensation driver 130 includes current sources 131 and 132 and switches 133 to 136, which are coupled as shown in FIG. 1. Current sources 131 and 132 may also herein be referred to as compensation driver current sources 131 and 132. Similarly, switches 133 to 136 may also herein be referred to as compensation driver switches 133 to 136. In one embodiment, switches 133 and 134 are PMOS transistors, whereas switches 135 and 136 are NMOS transistors. Also, in one embodiment, the same control signal is applied to the switches on the same leg of the driver. In other words, the same control signal (Vip_po2) is applied to switches 133 and 135. Similarly, the same control signal (Vin_po2) is applied to switches 134 and 136. As a result, in one embodiment, when switch 133 is on, switch 135 is off and vice versa. Similarly, in one embodiment, when switch 134 is on, switch 136 is off and vice versa. Also, in one embodiment, the control signal applied to one leg of the driver is the compliment of that applied to the other leg of the driver. In other words, Vip_po2 is the complement of Vin_po2. Thus, when a binary high signal is applied to switches 133 and 135, a binary low signal is applied to switches 134 and 136. Therefore, in one embodiment, when switch 133 is on, switch 135 is off, switch 134 is off, and switch 136 is on. Similarly, in one embodiment, when switch 133 is off, switch 135 is on, switch 134 is on, and switch 136 is off.

Current sources 111, 112, 121, 122, 131, and 132 are all programmable current sources that can be programmed in user mode (i.e., at runtime). In FIG. 1, each of current sources 111, 112, 121, 122, 131, and 132 is shown as a single current source. However, those skilled in the art would recognize that, in one embodiment, each of current sources 111, 112, 121, 122, 131, and 132 may in fact include a plurality of current sources coupled in parallel (which may herein be referred to as the internal legs of current sources 111, 112, 121, 122, 131, and 132). In one embodiment, this feature is used to program the amount of current from each of the current sources 111, 112, 121, 122, 131, and 132.

In one embodiment, main driver 110, pre-emphasis driver 120, and compensation driver 130 are differential output drivers. More specifically, in one embodiment, they are all H-tree drivers. It is to be noted that one or more of these drivers may be a driver type other than H-tree driver.

Pre-emphasis circuitry 100 receives input data, pre-emphasizes the input data, and outputs pre-emphasized data as output data (Von and Vop). This output data is then transmitted via a transmission medium to a receiver. In one embodiment, the input data and the control signals Vip, Vin, Vip_po1, Vin_po1, Vip_po2, and Vin_po2 (which are derived from the input data) are rail-to-rail signals. More specifically, in one embodiment, they are weak (in terms of their drive strength) rail-to-rail signals. On the other hand, in one embodiment, the output signals Vop and Von are differential peak-to-peak signals. In one embodiment, the output drivers (i.e., drivers 110, 120 and 130) amplify (in terms of their drive strength) the control signals to drive the external load at a specified electrical level. In other words, it is the role of the output driver to ensure that the output data Von and Vop achieve the required drive strength and specified electrical levels.

PVVC engine 140 and TDPTP controller 150 receive input data. They also receive the clock signal clk (not shown in FIG. 1). In one embodiment, PVVC engine 140 determines if the input data meets a predetermined data pattern and provides control signals to compensation driver switches 133 to 136. In one embodiment, PVVC engine 140 and compensation driver 130 compensate for input data dependent voltage variations in the output data (Von and Vop).

Data dependent voltage variations increase with increased data rates and increased capacitances between the current sources and switches of the drivers, e.g., nodes 165 and 175. These capacitances may be referred to as parasitic capacitances and the nodes at which they appear may be referred to as performance critical capacitive nodes. In some case, devices fabricated using smaller process nodes, have higher parasitic capacitances. The parasitic capacitance are also higher when there is a greater range covered by the pre-emphasis circuitry, which requires a greater degree of programmability and, therefore, a larger number of current sources and the accompanying parasitic capacitances. Thus, the data dependent voltage variation compensation of the embodiments of the present invention is particularly useful in pre-emphasis circuitry having higher parasitic capacitance and used in a higher data rate context.

TDPTP controller 150 receives the input data and controls adjustment of the output drive strength and pre-emphasis levels. In one embodiment, TDPTP controller 150 achieves this by controlling which of the internal legs of current sources 111, 112, 121, and 122 it switches on.

Figure 2:
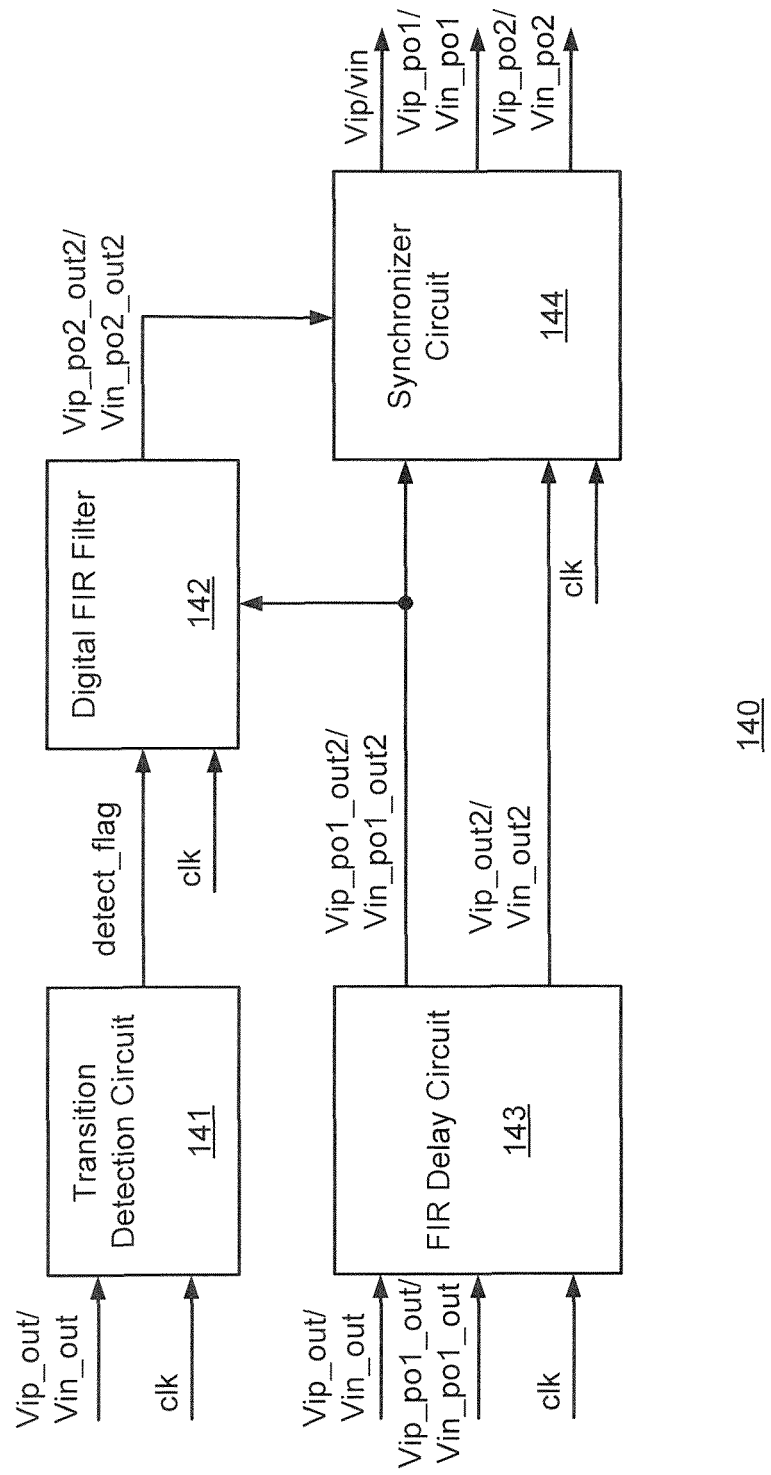
FIG. 2 is a more detailed diagram of one embodiment of the pre-emphasis voltage variation compensation engine of FIG. 1.

FIG. 2 is a more detailed diagram of one embodiment of the PVVC engine of FIG. 1. In one embodiment, PVVC engine 140 includes transition detection circuit 141, digital finite impulse response (FIR) filter 142, FIR delay circuit 143, and synchronizer circuit 144, which are coupled as shown in FIG. 2.

In one embodiment, transition detection circuit 141 receives the incoming data signal Vip_out/Vin_out and the clock signal clk and determines whether the data signal meets a predetermined pattern. It is to be noted that Vip_out is the same as the serialized input data and Vin_out is its complement. If the data meets a predetermined pattern, then transition detection circuit 141 asserts a detect_flag signal, which is sent to digital FIR filter 142. In one embodiment, the predetermined pattern is a 0 bit followed by two consecutive 1 bits. In such a case, there is a two-clock-cycle delay between the incoming data and the detect_flag signal. It is to be noted that this delay depends on the specific implementation of transition detection circuit 141 and the length of the predetermined data pattern to be detected.

In one embodiment, transition detection circuit 141 is programmable to detect different predetermined data patterns. More specifically, in one embodiment, transition detection circuit 141 is programmable in user mode to detect different predetermined data patterns. For example, in one embodiment, the predetermined data pattern is a data transition (i.e., a 0 followed by a 1 or a 1 followed by a 0).

FIR delay circuit 143 receives the clock signal clk and the data signals Vip_out/Vin_out and Vip_po1_out/Vin_po1_out. It is to be noted that Vip_po1_out/Vin_po1_out are delayed by one clock cycle relative to Vip_out/Vin_out. FIR delay circuit 143 then adds a two-clock-cycle latency to each of Vip_out/Vin_out and Vip_po1_out/Vin_po1_out, and outputs Vip_out2/Vin_out2 and Vip_po1_out2/Vin_po1_out2. As a result, Vip_out2/Vin_out2 and Vip_po1_out2/Vin_po1_out2 are delayed versions, by two clock cycles, of Vip_out/Vin_out and Vip_po1_out/Vin_po1_out, respectively. The delay produced by FIR delay circuit 143 matches the delay of transition detection circuit 141. It is to be noted that the delay produced by FIR delay circuit 143 is programmable. More specifically, the delay produced by FIR delay circuit 143 is programmable in user mode. For example, in another embodiment, where transition detection circuit 141 produces another delay, e.g., 3 clock cycles, then FIR delay circuit 143 is programmed to produce a 3 clock cycle delay between its input and output signals.

Digital FIR filter 142 receives detect_flag from transition detection circuit 141, Vip_po1_out2/Vin_po1_out2 from FIR delay circuit 143, and the clock signal clk. In one embodiment, the logical behavior of the FIR coefficients of digital FIR filter 142 are as follows:

$$Vip\_po2\_out2=(Vip\_po1\_out2) \text{ XOR (detect\_flag)}$$

$$Vin\_po2\_out2=(Vin\_po1\_out2) \text{ XOR (detect\_flag)},$$

where XOR represents the exclusive OR function. In other words, when detect_flag is asserted, the output (Vip_po2_out2/Vin_po2_out2) of digital FIR filter 142 is the inverse (or one's complement) of its input (Vip_po1_out2/Vin_po1_out2). When detect_flag is not asserted, the output of digital FIR filter 142 is the same as the input. It is to be noted that each of Vip_po2_out2 and Vin_po2_out2 has an additional two-clock-cycle latency with respect to Vip_po1_out2 and Vin_po1_out2, respectively. This latency depends on the specific implementation of digital FIR filter 142 and the length of the predetermined data pattern to be detected. It is also to be noted that in one embodiment, digital FIR filter 142 may include the functionality of transition detection circuit 141, FIR delay circuit 143, or both transition detection circuit 141 and FIR delay circuit 143. In one embodiment, the detect_flag is asserted for one bit, more specifically for the bit where the data transition occurs. For example, where a data transition occurs from 0 to 1, then the detect_flag is asserted during the 1 bit. Thus, in one embodiment, for each data bit for which digital FIR filter 142 provides boost, digital FIR filter 142 provides a boost for the unit interval of the data bit, where the unit interval is the duration of the data bit.

In one embodiment, the response of digital FIR filter 142 is programmable. More specifically, it is programmable in user mode. Among other things, the programmability of the response allows digital FIR filter 142 to serve its function across various data rates.

Synchronizer 144 receives Vip_po2_out2/Vin_po2_out2 from digital FIR filter 142, Vip_po1_out2/Vin_po1_out2 and Vip_out2/Vin_out2 from FIR delay circuit 143, and the clock signal clk. Synchronizer 144 adds a two-clock-cycle delay to Vip_po1_out2/Vin_po1_out2 and Vip_out2/Vin_out2 to synchronize them to Vip_po2_out2/Vin_po2_out2. As a result, in the data Vip/Vin, Vip_po1/Vin_po1, and Vip_po2/Vin_po2 output by synchronizer 144, Vip_po1/Vin_po1, and Vip_po2/Vin_po2 are synchronized (i.e., latency matched) with respect to Vip/Vin. As shown in FIG. 1, the data Vip/Vin, Vip_po1/Vin_po1, and Vip_po2/Vin_po2 (which may also herein be referred to as control signals) are respectively sent to drivers 110, 120, and 130. It is to be noted that the data Vip/Vin, Vip_po1/Vin_po1, and Vip_po2/Vin_po2 are delayed (either as a result of an intentional delay added by synchronizer 144 for purposes of latency matching and/or as a result of inherent delays due to processing by synchronize 144) versions of Vip_out2/Vin_out2, Vip_po1_out2/Vin_po1_out2, and Vip_po2_out2/Vin_po2_out2, respectively.

Compensation driver 130 adjusts the overall output voltage Vop and Von of the drivers so as to compensate for data dependent voltage variations. In one embodiment, output voltages Vop and Von have the following values:

$$Vop=(Vip*Sa)-(Vip\_po1*Sb)+(Vip\_po2*Sc)$$

$$Von=(Vin*Sa)-(Vin\_po1*Sb)+(Vin\_po2*Sc),$$

where Sa, Sb, and Sc respectively represent the drive strength scaling factors for drivers 110, 120, and 130. It is to be noted that Sa, Sb, and Sc are all programmable. More specifically, they are programmable in user mode. It is also to be noted that the orientation of the input signals determine the polarity of the mixing used for calculating the values of Vop and Von. More specifically, Vip and Vip_po2 have the same orientation whereas Vip_po1 has an opposite orientation form that of both Vip and Vip_po2. Similarly, Vin and Vin_po2 have the same orientation whereas Vin_po1 has an opposite orientation form that of both Vip and Vip_po2.

When PVVCE 140 detects a predetermined data pattern, it provides control signals to compensation driver 130 to adjust the output voltages Vop and Von. More specifically, PVVCE 140 provides control signals to switches 133 to 136 of compensation driver 130 which results in adjusting the output voltages Vop and Von. In one embodiment, when PVVCE 140 (by way of FIR filter 142) provides boost using the compensation driver 130, Vip_po2 has a binary value of 1, whereas Vin_po2 has a binary value of 0. This results in a positive polarity on output Vop and a negative polarity on output Von. Conversely, in the non-boost condition, Vip_po2 has a binary value of 0, whereas Vin_po2 has a binary value of 1. This results in a negative polarity on output Vop and a positive polarity on output Von. During the boost condition, the adjustments in the output voltages Vop and Von result in boosting the current at (i.e., providing additional current to) the parasitic capacitive nodes (e.g., nodes 165 and 175). The current boost provided by compensation driver 130 decreases the settling time needed to charge or discharge the parasitic capacitive nodes. In one embodiment, due to this current boost, the parasitic capacitive nodes charge or discharge within a unit interval which results in the removal of data dependent voltage variations when the pre-emphasis filter is enabled (i.e., when pre-emphasis driver 120 is enabled). It is to be noted that in one embodiment, the additional boost from compensation driver 130 decreases the settling time needed to charge or discharge the parasitic capacitive nodes without sacrificing performance (e.g., data speed) or flexibility (e.g., programmability) of the transmitter.

In one embodiment, in addition to detecting a predetermined data pattern, PVVCE 140 also evaluates the density of transitions and adjusts the current of current sources 131 and 132 accordingly. In one embodiment, the density of transitions is evaluated by transition detection circuit 141. Thereafter, transition detection circuit 141 may provide control signals to current sources 131 and 132 of compensation driver 130 to increase their current. In one embodiment, transition detection circuit 141 may provide these control signals to current sources 131 and 132 via TDPTP controller 150.

Figure 3:
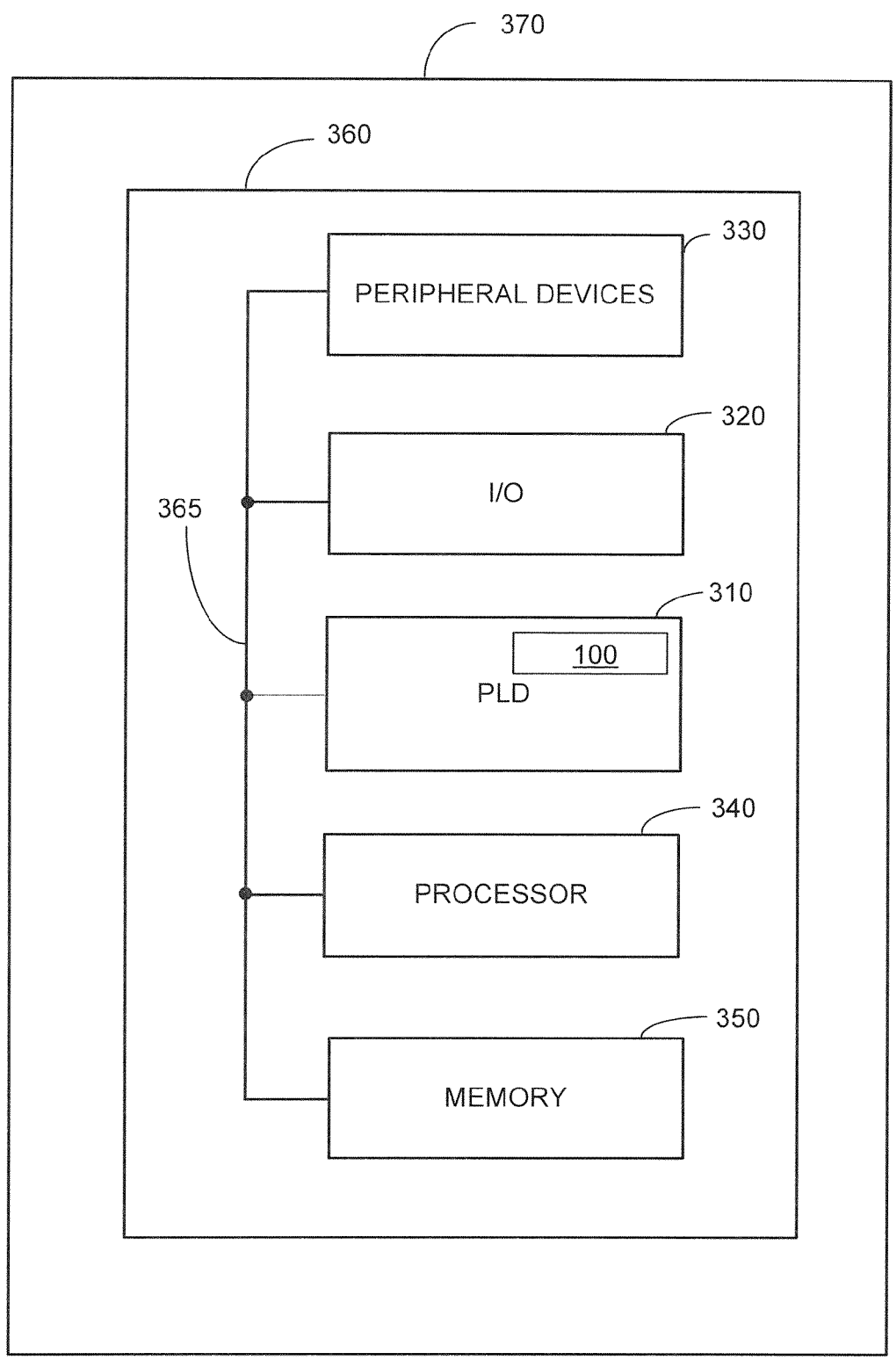
FIG. 3 illustrates an exemplary data processing system including an exemplary programmable logic device in which an embodiment of a pre-emphasis circuitry in accordance with the present invention might be implemented.

FIG. 3 illustrates an exemplary data processing system including an exemplary PLD in which an embodiment of a pre-emphasis circuitry in accordance with the present invention might be implemented.

Circuits including a pre-emphasis circuitry according to an embodiment of the present invention might be included in a variety of ICs, including ICs that are PLDs. PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

FIG. 3 illustrates, by way of example, PLD 310 in data processing system 300. As one example, an embodiment of a pre-emphasis circuitry of this invention (e.g., pre-emphasis circuitry 100) may be implemented in PLDs, such as PLD 310. In one embodiment, pre-emphasis circuitry 100 is on the same die/chip as PLD 310. In one embodiment, the logic for pre-emphasis circuitry 100 is supported by the programmable PLD core of PLD 310. Data processing system 300 may include one or more of the following components: processor 340, memory 350, input/output (I/O) circuitry 320, and peripheral devices 330. These components are coupled together by system bus 365 and are populated on circuit board 360 which is contained in end-user system 370. A data processing system such as system 300 may include a single end-user system such as end-user system 370 or may include a plurality of systems working together as a data processing system.

System 300 can be used in a wide variety of applications, such as computer networking, data networking, instrumentation, video processing, digital signal processing (DSP), or any other application where the advantage of using programmable or reprogrammable logic is desirable. PLD 310 can be used to perform a variety of different logic functions. For example, PLD 310 can be configured as a processor or controller that works in cooperation with processor 340 (or, in alternative embodiments, a PLD might itself act as the sole system processor). PLD 310 may also be used as an arbiter for arbitrating access to a shared resource in system 300. In yet another example, PLD 310 can be configured as an interface between processor 340 and one of the other components in system 300. It should be noted that system 300 is only exemplary.

In one embodiment, system 300 is a digital system. As used herein a digital system is not intended to be limited to a purely digital system, but also encompasses hybrid systems that include both digital and analog subsystems.

An embodiment of the pre-emphasis circuitry of the present invention does most of the processing before the last stage of the transmit buffer. As such, it has little or no adverse impact on the performance of the existing circuit. Moreover, as, in one embodiment, PVVC engine 140 is implemented in digital logic, it can easily be scaled and migrated to future process nodes.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A pre-emphasis circuitry comprising:
   a pre-emphasis voltage variation compensation (PVVC) engine including (a) a transition detection circuit, (b) a digital finite impulse response (FIR) filter coupled to the transition detection circuit, and (c) an FIR delay circuit coupled to the digital FIR filter, wherein the FIR delay circuit introduces latency to match delay produced by the transition detection circuit; and
   a compensation driver coupled to the PVVC engine.

2. The pre-emphasis circuitry of claim 1, wherein the compensation driver reduces data dependent voltage variations in pre-emphasis provided by the pre-emphasis circuitry.

3. The pre-emphasis circuitry of claim 1, wherein in response to a predetermined data pattern detected by the PVVC engine, the compensation driver provides an additional boost to performance critical capacitive nodes of the pre-emphasis circuitry, wherein the additional boost causes the performance critical capacitive nodes to charge or discharge more rapidly.

4. The pre-emphasis circuitry of claim 1 further comprising:
a main driver, and
a pre-emphasis driver coupled to the main driver and the compensation driver.

5. The pre-emphasis circuitry of claim 4, wherein the PVVC engine further includes a synchronizer circuit coupled to the digital FIR filter and the FIR delay circuit, wherein the synchronizer circuit synchronizes data to be sent to the main driver, the pre-emphasis driver, and the compensation driver.

6. The pre-emphasis circuitry of claim 4, wherein:
the main driver includes main driver current sources, main driver switches coupled to the main driver current sources, and resistors coupled to the main driver switches;
the pre-emphasis driver includes pre-emphasis current sources and pre-emphasis switches coupled to the pre-emphasis current sources; and
the compensation driver includes compensation driver current sources and compensation driver switches coupled to compensation driver current sources.

7. A programmable logic device including the pre-emphasis circuitry of claim 1.

8. A digital system comprising a programmable logic device including the pre-emphasis circuitry of claim 1.

9. A method of pre-emphasis, the method comprising:
detecting a predetermined data pattern;
adjusting boost in nodes of a pre-emphasis circuitry in response to the detecting; and
introducing latency to match delay produced by the detecting the predetermined data pattern, wherein the latency is introduced by a finite impulse response (FIR) delay circuit.

10. The method of claim 9, wherein the adjusting includes providing additional current to performance critical capacitive nodes.

11. The method of claim 10, wherein the additional current reduces data dependent voltage variations in pre-emphasis provided by the pre-emphasis circuitry.

12. The method of claim 9, wherein the detecting includes:
detecting a data transition; and
detecting a predetermined number of identical digits following the data transition.

13. The method of claim 10, wherein the adjusting includes:
switching on switches of a compensation driver to provide the additional current.

14. The method of claim 9 further comprising:
synchronizing data to be sent to a main driver, a pre-emphasis driver, and a compensation driver.

15. A pre-emphasis circuitry comprising:
a main driver,
a pre-emphasis driver coupled to the main driver,
a compensation driver coupled to the main driver and the pre-emphasis driver, and
a pre-emphasis voltage variation compensation (PVVC) engine coupled to the main driver, the pre-emphasis driver, and the compensation driver, the PVVC engine including a transition detection circuit, a digital finite impulse response (FIR) filter coupled to the transition detection circuit, an FIR delay circuit coupled to the digital FIR filter, and a synchronizer circuit coupled to the digital FIR filter and the FIR delay circuit.

16. The pre-emphasis circuitry of claim 15, wherein the FIR delay circuit introduces latency to match delay produced by the transition detection circuit and the synchronizer circuit synchronizes data to be sent to the main driver, the pre-emphasis driver, and the compensation driver.

17. The pre-emphasis circuitry of claim 15, wherein:
the main driver includes main driver current sources, main driver switches coupled to the main driver current sources, and resistors coupled to the main driver switches;
the pre-emphasis driver includes pre-emphasis current sources and pre-emphasis switches coupled to the pre-emphasis current sources; and
the compensation driver includes compensation driver current sources and compensation driver switches coupled to compensation driver current sources.

18. The pre-emphasis circuitry of claim 15, wherein in response to a predetermined data pattern detected by the PVVC engine, the compensation driver provides an additional boost to performance critical capacitive nodes of the pre-emphasis circuitry.

19. The pre-emphasis circuitry of claim 18, wherein the additional boost reduces data dependent voltage variations in pre-emphasis provided by the pre-emphasis circuitry.

20. A programmable logic device including the pre-emphasis circuitry of claim 15.

21. A digital system comprising a programmable logic device including the pre-emphasis circuitry of claim 15.

* * * * *